(12) United States Patent
Otani

(10) Patent No.: US 7,488,898 B2
(45) Date of Patent: Feb. 10, 2009

(54) LAND STRUCTURE, PRINTED WIRING BOARD, AND ELECTRONIC DEVICE

(75) Inventor: Koji Otani, Atsugi (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 11/270,102

(22) Filed: Nov. 9, 2005

(65) Prior Publication Data
US 2006/0219430 A1  Oct. 5, 2006

(30) Foreign Application Priority Data
Mar. 29, 2005  (JP)  ............................. 2005-095084

(51) Int. Cl.
H01R 12/04 (2006.01)
H05K 1/11 (2006.01)

(52) U.S. Cl. .................. 174/261; 174/260; 361/767

(58) Field of Classification Search ............. 174/260, 174/261; 361/767–776
See application file for complete search history.

(56) References Cited

U.S. PATENT DOCUMENTS

| | | | |
|---|---|---|---|
| 4,091,529 A * | 5/1978 | Zaleckas | 29/843 |
| 4,767,892 A | 8/1988 | Kobari | |
| 5,406,458 A * | 4/1995 | Schutt | 361/767 |
| 5,486,657 A * | 1/1996 | Bell et al. | 174/261 |
| 5,713,126 A * | 2/1998 | Sakemi | 29/843 |
| 6,548,766 B2* | 4/2003 | Daido | 174/261 |
| 6,566,611 B2* | 5/2003 | Kochanowski et al. | 174/261 |
| 6,612,023 B1* | 9/2003 | Lichtenwalter et al. | 29/840 |
| 7,000,312 B2* | 2/2006 | Fukunabe et al. | 29/843 |

FOREIGN PATENT DOCUMENTS

| | | |
|---|---|---|
| EP | 0 557 081 | 8/1993 |
| JP | 5-46066 | 6/1993 |
| JP | 7-254774 | 10/1995 |
| JP | 9223769 | 6/1997 |
| JP | 2000-315852 | 11/2000 |

* cited by examiner

Primary Examiner—Jeremy C Norris
(74) Attorney, Agent, or Firm—Ladas & Parry LLP

(57) ABSTRACT

A land part where a connection part of an electronic part is soldered, includes a head end part. The head end part includes an inclination part. The inclination part may be formed by an end side. The end side may make a designated angle from an end line of the connection part of the electronic part.

14 Claims, 7 Drawing Sheets

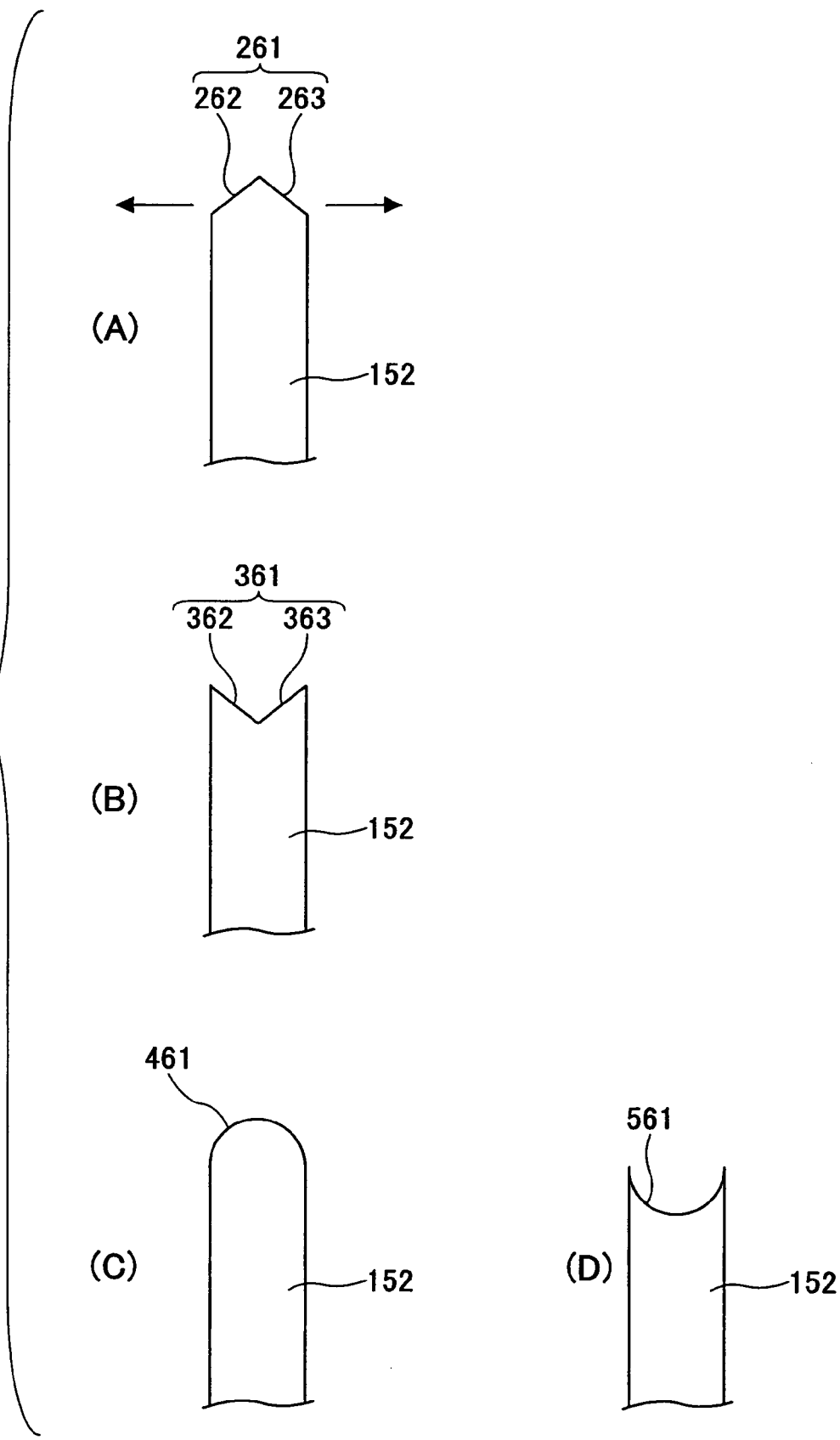

LAND STRUCTURE, PRINTED WIRING BOARD, AND ELECTRONIC DEVICE

BACKGROUND OF THE INVENTION

1. Field of the Invention

The present invention generally relates to land structures, printed wiring boards, and electronic devices, and more particularly, to a land structure, printed wiring board, and electronic device wherein an electronic part is soldered.

2. Description of the Related Art

Generally, a land part where a lead of an IC, for example, is soldered has a rectangular configuration. Furthermore, a reflow soldering method or a soldering flow method is used as a method for soldering the lead of the IC, for example, and the land part.

In the reflow soldering method, solder paste or the like is printed in advance on the lead or the land part. After an electronic part is mounted, heat is applied so that the lead and the land part are soldered. Hence, both the printed wiring board and the electronic part are heated.

In this case, according to the reflow soldering method, the amount of the solder can be adjusted in advance so as to be proper. Therefore, even if a pitch between the adjacent leads and lands is set to be narrow, it is possible to prevent a bridge from being generated between the lead and an adjacent land part.

However, since it is required to heat the printed wiring board, it is necessary to use a printed wiring board having a high heating resistance. This increases manufacturing cost. In addition, since it is necessary to apply the solder paste, the number of manufacturing processes is increased.

On the other hand, in the soldering flow, the lead and the land part are soldered by making a printed wiring board where an electric part is tentatively fixed come in contact with a molten solder flow. In the soldering flow, it is not necessary to heat the printed wiring board. Therefore, the heating resistance of the printed wiring board may be low so that the manufacturing cost can be reduced.

However, depending on the direction of flow of the solder, the amount of the supplied solder may be varied in positions of the lead and the land part. Therefore, a bridge is generated between the lead and an adjacent land part in a position where the supplied amount of the solder is large in a case where the pitch between the leads and the lands is narrow. The amount of the solder is insufficient in a position where the supplied amount of the solder is small in a case where the pitch between the leads and the lands is narrow. This causes a bad connection between the lead and the land part.

Because of this, conventionally, the soldering flow cannot correspond to the IC where the pitch between the leads and the lands is narrow.

A soldering terminal having a structure where on a plate surface facing a stretching part of a flat part, a penetrating hole is formed, and a gap is linked with a solder surface of the flat part by the penetrating hole, and fused solder permeates into the gap between the flat part and a pad and a gap between a bent part and the pad, has been suggested. See Japan Laid-Open Patent Application Publication No. 9-223769.

It has been desired that the soldering for the IC where the pitch between the lead and the land is narrow is done by the soldering flow so that the soldering is done easily and at a low cost.

SUMMARY OF THE INVENTION

Accordingly, it is a general object of the present invention to provide a novel and useful land structure, printed wiring board, and electric device in which one or more of the problems described above are eliminated.

Another and more specific object of the present invention is to provide a land structure, printed wiring board, and electronic device wherein the soldering can be done by supplying a proper amount of the solder to the lead and the land.

The above object of the present invention is achieved by a land part where a connection part of an electronic part is soldered, including:

a head end part;

wherein the head end part includes an inclination part.

The above object of the present invention is also achieved by a printed wiring board where a land part is formed, the land part being where a connection part of an electronic part is soldered, the land part including:

a head end part;

wherein the head end part includes an inclination part.

The above object of the present invention is also achieved by an electronic device, including:

an electronic part;

a printed wiring board where a land part is formed, the land part being where a connection part of an electronic part is soldered, the land part comprising:

a head end part;

wherein the head end part includes an inclination part.

The inclination part may be formed by an end side and the end side may make a designated angle from an end line of the connection part of the electronic part.

The inclination part may be formed by bending an end side of the land part so that a convex portion is formed.

The convex portion of the inclination part may be curved.

The inclination part may be formed by bending an end side of the land part so that a concave portion is formed.

The concave portion of the inclination part may be curved.

According to the present invention as described above, a flow of a solder supplied to the land can be controlled by making the head end part of the land include the inclination part. Hence, the amount of the solder supplied to a connection part of the lead and the land is properly set so that it is possible to prevent a bridge or a non-soldering state from being generated even if the pitch between the leads and lands is set to be narrow. Accordingly, it is possible to solder securely.

Other objects, features, and advantages of the present invention will become more apparent from the following detailed description when read in conjunction with the accompanying drawings.

BRIEF DESCRIPTION OF THE DRAWINGS

FIG. 7 is a plan view of a land part of a second embodiment of the present invention.

DETAILED DESCRIPTION OF THE PREFERED EMBODIMENTS

A description is now given, with reference to FIG. 1 through FIG. 7, of embodiments of the present invention.

Figure 1:
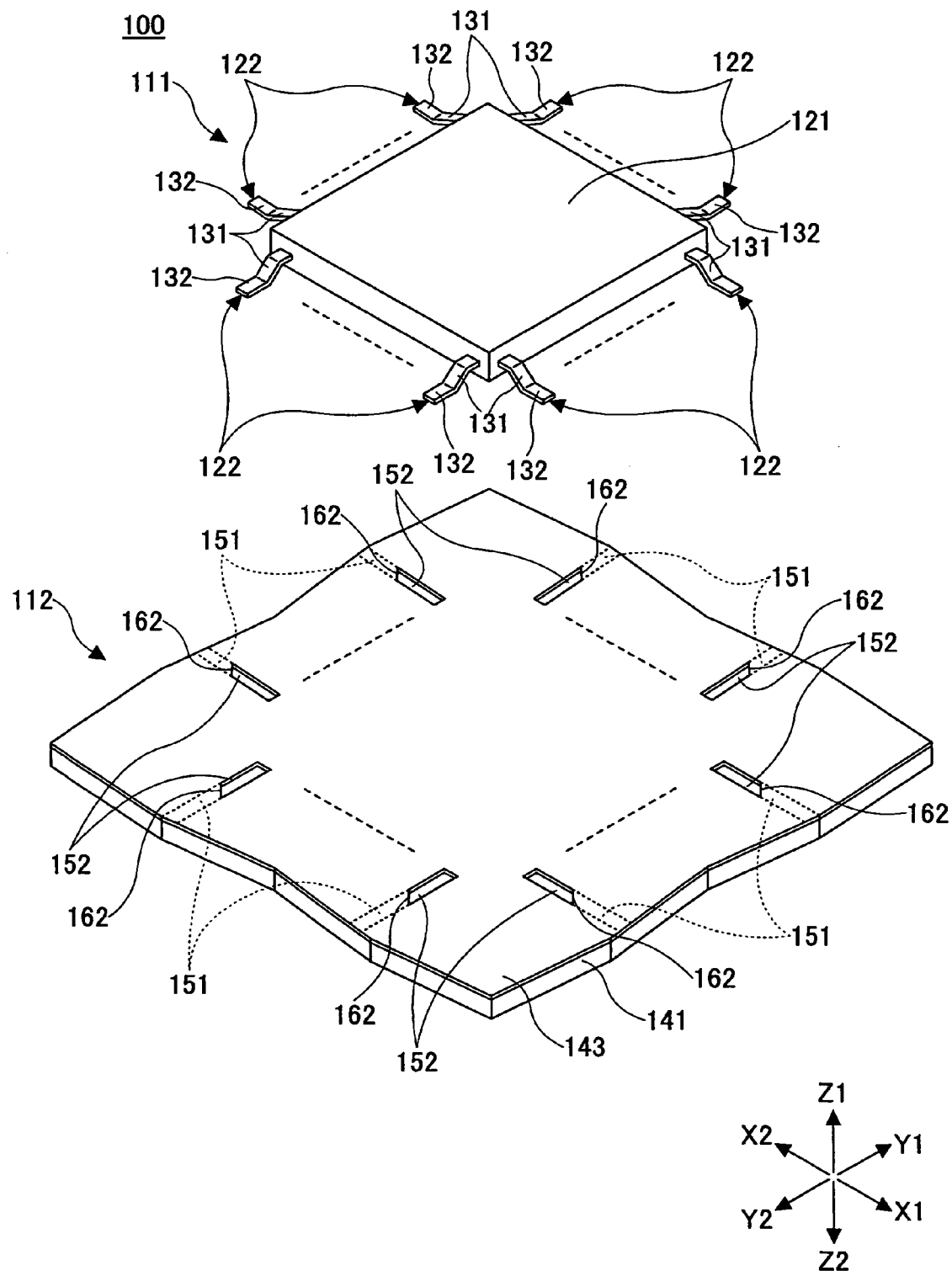
FIG. 1 is an exploded perspective view of an electronic part of a first embodiment of the present invention.
Figure 2:
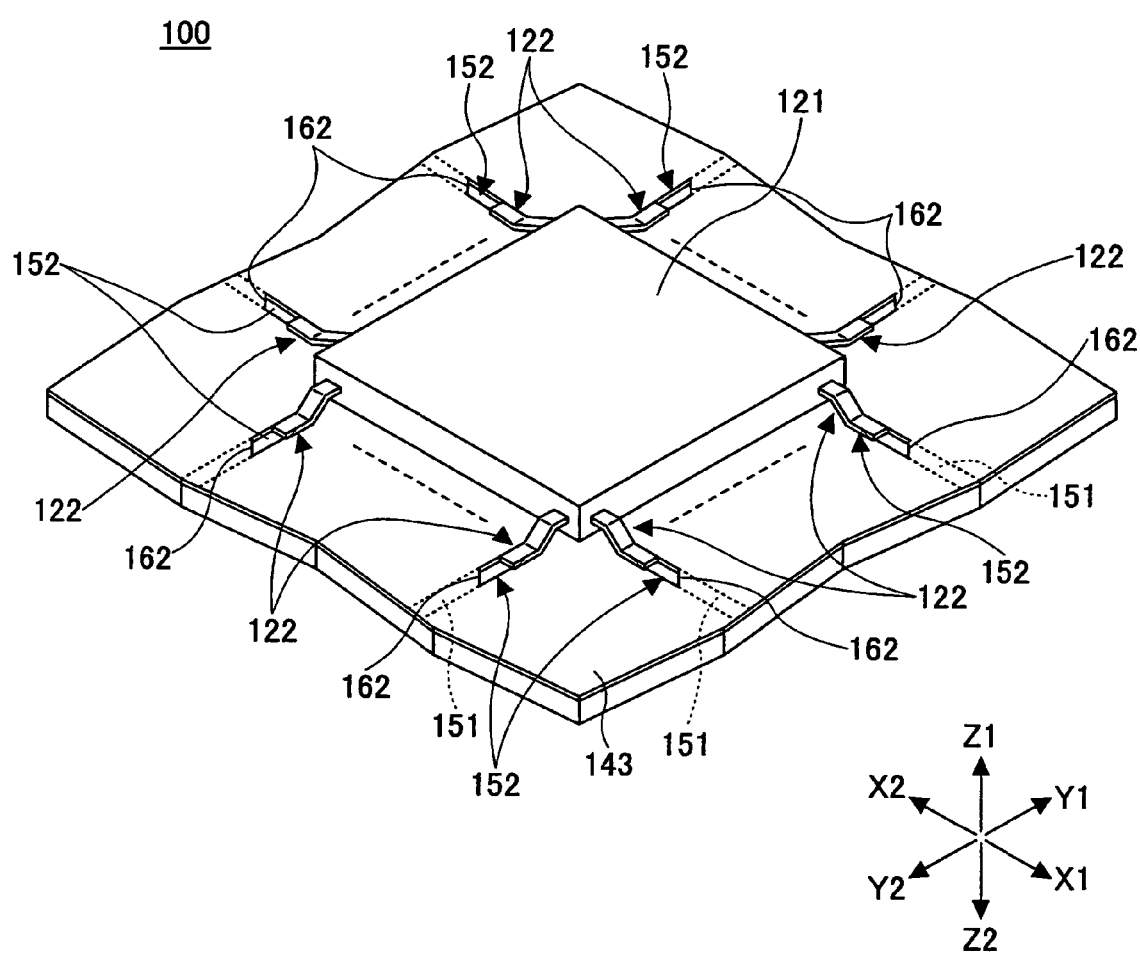
FIG. 2 is a perspective view of the electronic part of the first embodiment of the present invention.

FIG. 1 is an exploded perspective view of an electronic part of a first embodiment of the present invention. FIG. 2 is a perspective view of the electronic part of the first embodiment of the present invention.

An electronic device 100 of the first embodiment of the present invention has a structure where an electronic part 111 is soldered on a printed wiring board 112.

First Embodiment

[Electronic Part 111]

The electronic part 111 includes a semiconductor integrated circuit and has a structure where leads 122 extend from an IC main body 121. The IC main body has a structure where an IC chip is sealed by resin. The lead 122 is connected to the IC chip by a wire or the like.

The lead 122 has a so-called surface mounting type gull-wing configuration. The lead 122 includes an extending part 131 and a connection part 132.

The extending part 131 extends from the IC main body 121 and is also bent in a direction of a bottom surface of the IC main body 121, namely a Z2 direction. The connection part 132 extends from a head end of the extending part 131.

The connection part 132 is bent from the head end of the extending part 131 so as to be almost parallel to the bottom surface of the IC main body 121. More specifically, the connection part 132 is at an angle slightly downward in the Z2 direction from the above-mentioned position parallel to the bottom surface of the IC main body 121. The connection part 132 is soldered to the printed wiring board 112.

[Printed Wiring Board 112]

The printed wiring board 112 has a structure where a wiring pattern 142 is formed on an epoxy resin substrate 141 by a copper foil. A substantially whole surface of the printed wiring board 112 is covered with a resist film 143.

The wiring pattern 142 includes a wiring part 151 and a land part 152. The wiring part 151 is formed below the resist film 143. The wiring part 151 is a pattern for wiring in the electronic part 111.

The land part 152 is a part where the resist film 143 provided on the wiring pattern 142 is eliminated and the soldering with the connection part 132 of the lead 122 is provided.

[Land Part 152]

Figure 3:
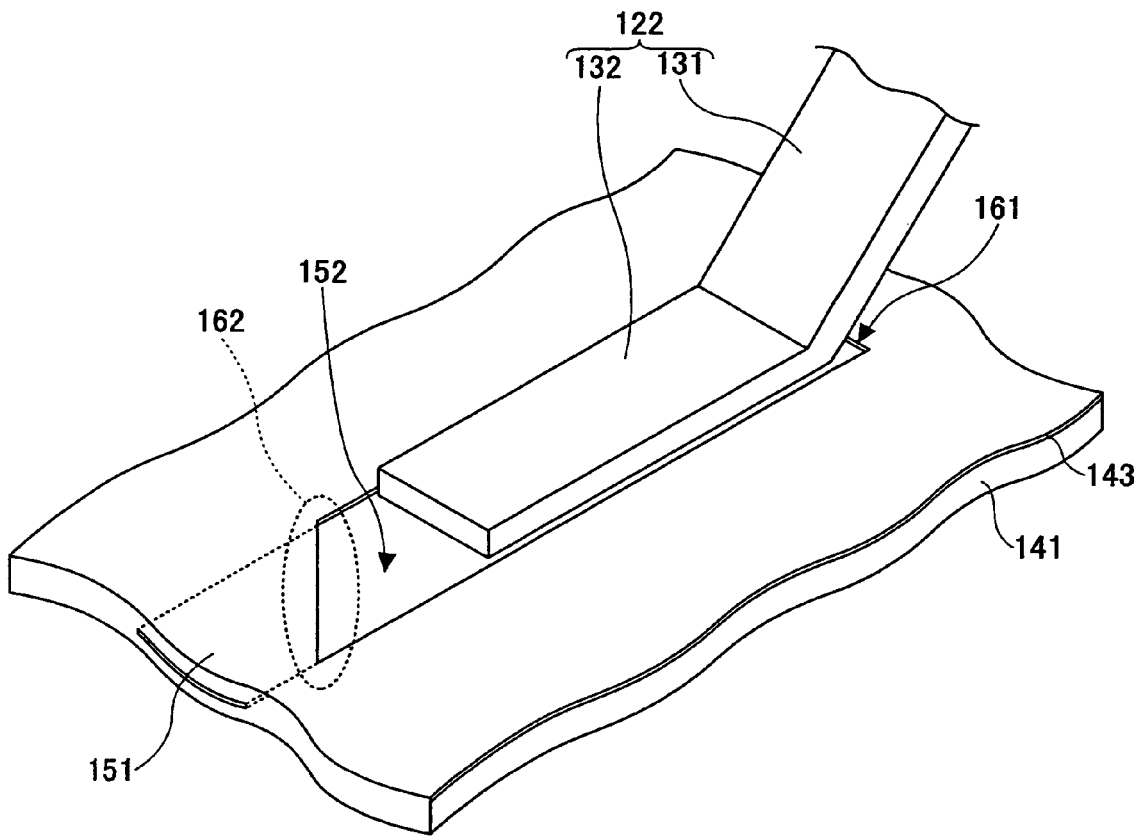
FIG. 3 is a perspective view of a main part of the electronic part of the first embodiment of the present invention.
Figure 3:
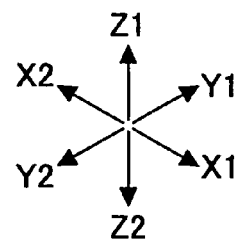
Figure 4:
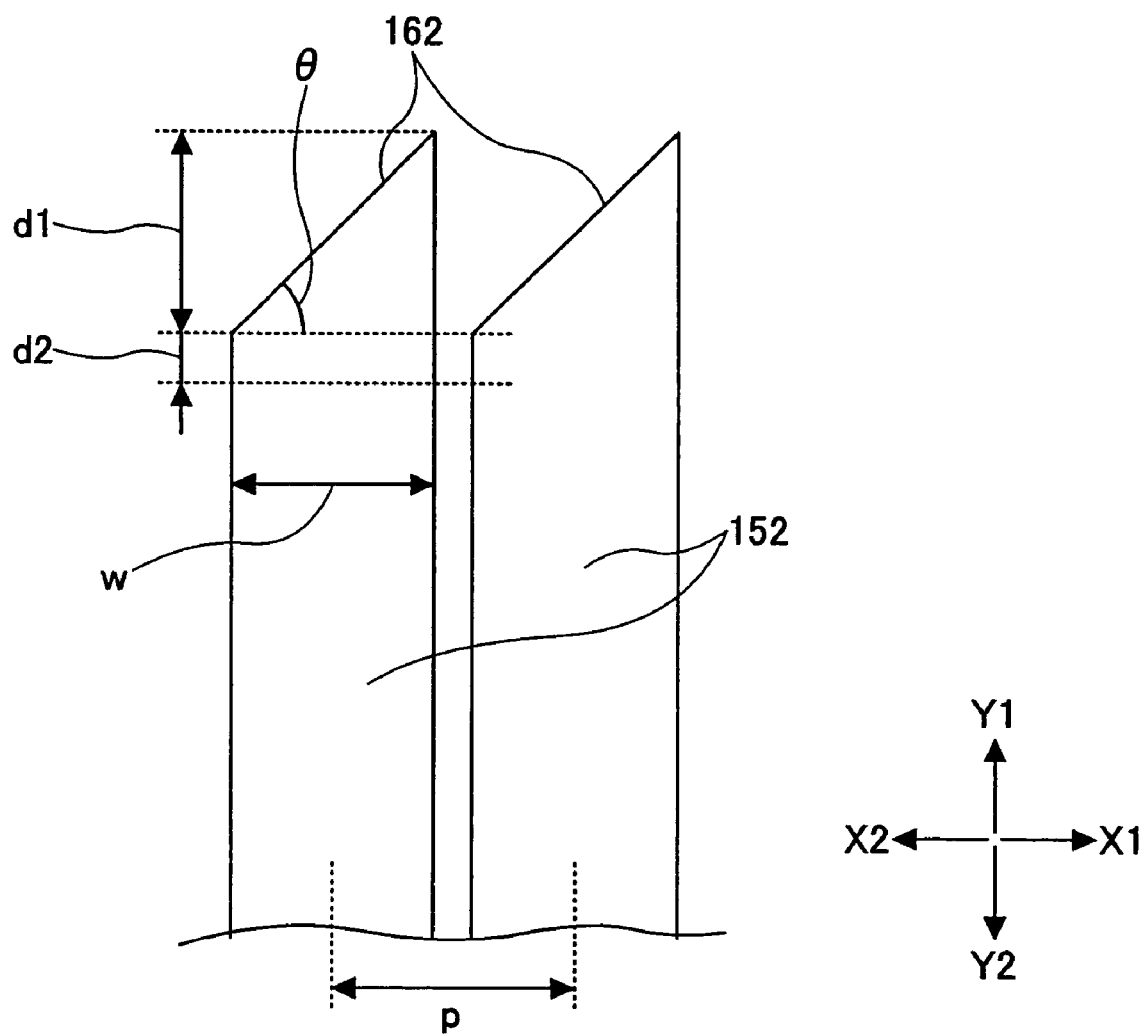
FIG. 4 is a partial plan view of a land part of the first embodiment of the present invention.
Figure 5:
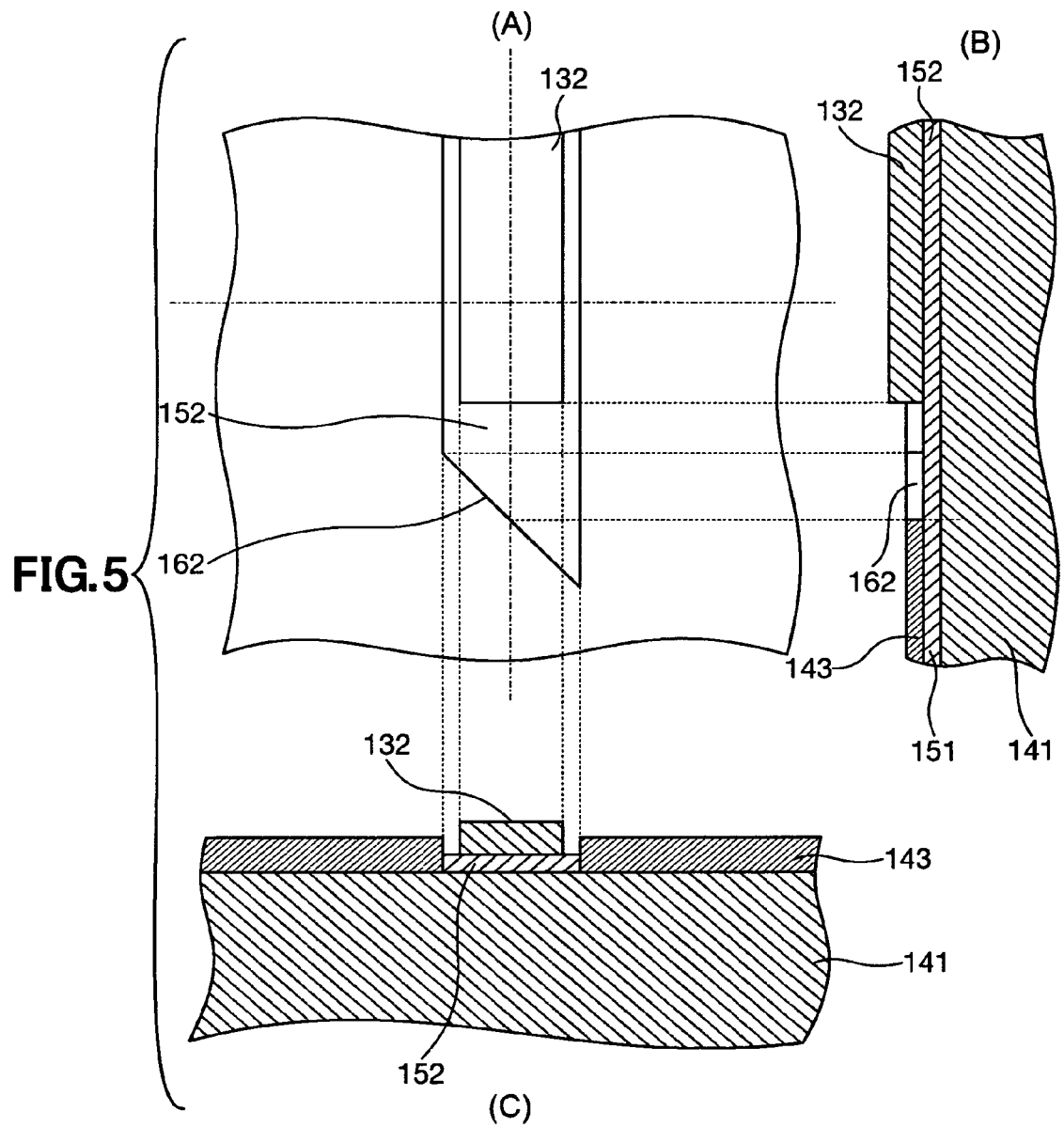
FIG. 5 is a partial structural view of the land part and a lead of the first embodiment of the present invention.

FIG. 3 is a perspective view of a main part of the electronic part of the first embodiment of the present invention. FIG. 4 is a partial plan view of a land part 152 of the first embodiment of the present invention. FIG. 5 is a partial structural view of the land part 152 and a lead of the first embodiment of the present invention.

An end side 161 situated at an internal circumferential side of the land part 152 is formed in the substantially same position as an end part of the connection part 132 of the lead 122 at a side of the IC main part 121 or formed at the side of the IC main part 121 closer than the end part of the connection part 132. Furthermore, an end side 162 situated at an external circumferential side of the land part 152 forms an inclination part. In other words, the end side 162 makes a designated angle from an end line of the connection part 132.

The angle θ, shown in FIG. 4, formed by the end side 162 of the land part 152 is approximately 30 through 45 degrees from the end line of the connection part 132 of the lead 122. In addition, a width w, also shown in FIG. 4, of the land part 152 is substantially the same as or slightly wider than a width of the connection part 132 of the lead 122.

In a case where the solder is flowed from a Y1 direction to a Y2 direction so as to come to the end side 162 of the land part 152, the solder is led back in the Y1 direction by the inclination part so that the solder is supplied to the end surface of the connection part 132 of the lead 122. Under this structure, it is possible to prevent a non-soldering state between the lead 122 and the land part 152 from being generated.

In a case where the solder is flowed from a X2 direction to a X1 direction so as to come to the end side 162 of the land part 152, the solder is led in a head end direction, namely in the Y2 direction by the inclination part so that over-supply of the solder to the end surface of the connection part 132 of the lead 122 is prevented. Under this structure, it is possible to prevent a bridge between the neighboring lead 122 and the land part 152 from being generated.

[Action]

Figure 6:
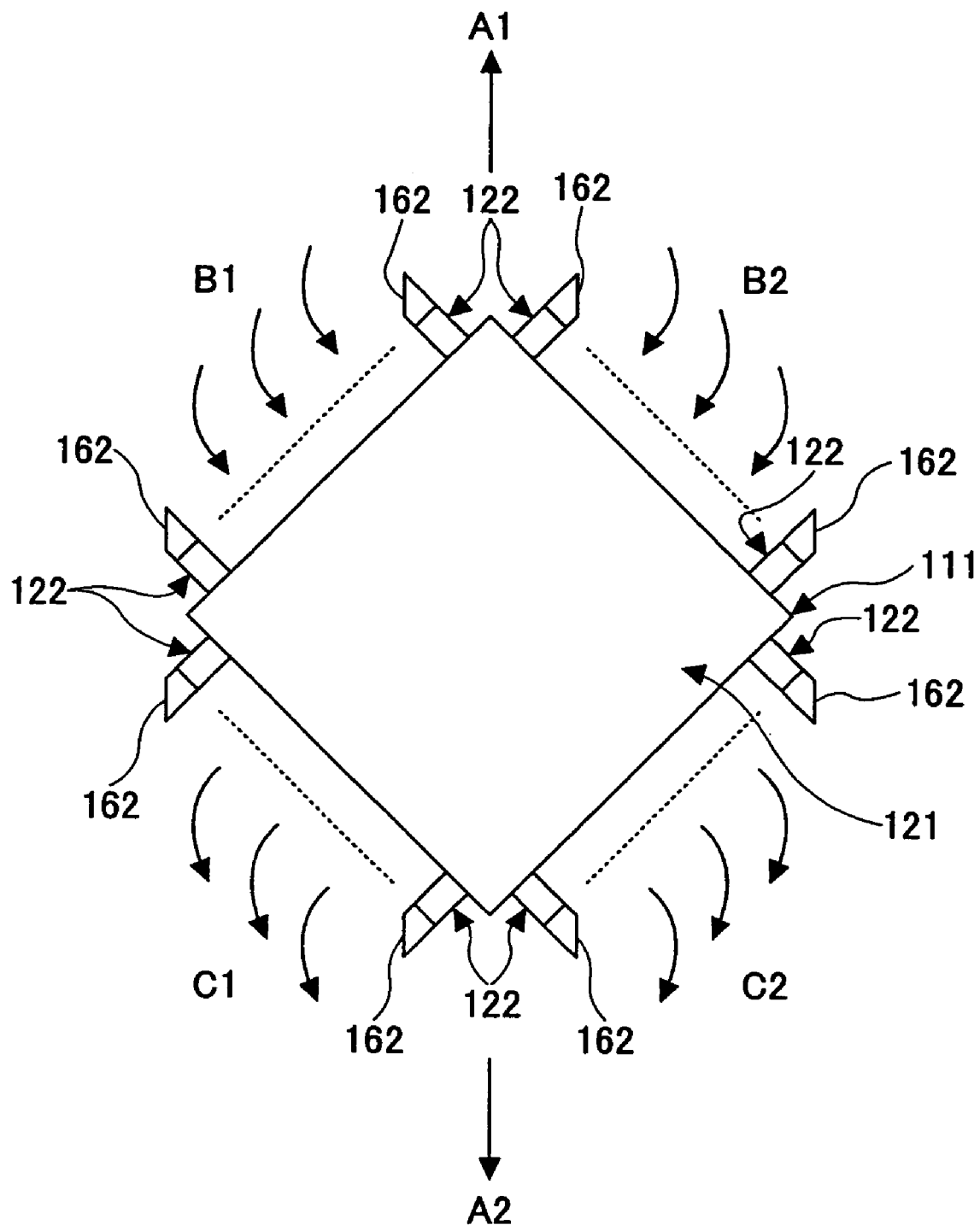
FIG. 6 is a plan view of an IC main body of the first embodiment of the present invention.

FIG. 6 is a plan view of the IC main body 121 of the first embodiment of the present invention.

Here, an action in a case where the electronic part 111 shown in FIG. 1 and FIG. 2 is soldered with the printed wiring board 112 is discussed.

In this case, a flow of the molten solder from an A1 direction to an A2 direction is made. The end side 162 of the land part 152 of the printed wiring board 112 is formed parallel to the A1 and A2 directions.

In a case where the electronic part 111 is fixed so that the connection part 132 of the lead 122 is situated at the same position as the land part 152 and the molten solder from an A1 direction to an A2 direction is flowed, the solder comes in contact with the end surface in the A1 direction of the IC main body 121. As a result of this, the solder is stagnated at the end surface of the A1 direction side of the IC main body 121.

In addition, it is difficult for the solder to be supplied to the end surface of the A2 direction side of the IC main body 121 so that the solder may be stagnated at the end surface of the A2 direction side of the IC main body 121.

In this case, by making the end side 162 of the land part 152 parallel with the flow direction of the solder, namely the A1 and A2 directions, at the A1 direction side of the IC main body 121, the solder is led in the end surface direction of the IC main body 121, namely the B1 and B2 directions. As a result of this, it is possible to prevent stagnation of the solder.

In addition, at the A2 direction side of the IC main body 121, the solder is led from external side of the IC main body 121, namely in the C1 and C2 directions. As a result of this, it is possible to prevent stagnation of the solder.

Thus, the stagnation of the solder at the land part 152 is prevented. Therefore, the solder can be applied to the connection part 132 of the lead 122 and to the land part 152 with neither too much nor too little being applied. Hence, it is possible to prevent the bridge between the lead 122 and an adjacent land part 152 from being formed. In addition, it is possible to prevent the non-soldering state between the lead 122 and the land part 152 corresponding to the lead 122.

Second Embodiment

FIG. 7 is a plan view of a land part of a second embodiment of the present invention.

In the first example, the inclination part is formed in a straight line and the solder is supplied or discharged to the side of the connection part 132. However, the present invention is not limited to this.

For example, as shown in FIG. 7-(A), an end side 261 of the land part 152 is bent in a convex shape so as to form inclination portions 262 and 263. The solder is supplied and discharged by the inclination portions 262 and 263 so that the stagnation of the solder is prevented. Furthermore, by changing lengths of the inclination portions 262 and 263 or an angle formed by inclination portions 262 and 263, it is possible to change the balance between the supply and discharge of the solder.

In addition, as shown in FIG. 7-(B), an end side 361 of the land part 152 is bent in a concave shape so as to form inclination portions 362 and 363. The solder is supplied and discharged by the inclination portions 362 and 363, as well as the inclination portions 262 and 263, so that the stagnation of the solder is prevented. Furthermore, by changing lengths of the inclination portions 362 and 363 or an angle formed by inclination portions 362 and 363, it is possible to change the balance between the supply and discharge of the solder.

Furthermore, as shown in FIG. 7-(C), a convex portion of an end side 461 of the land part 152 may be curved. The solder is supplied and discharged by the curved portion of the end side 461, so that the stagnation of the solder is prevented.

In addition, as shown in FIG. 7-(D), a concave portion of an end side 561 of the land part 152 may be curved. The solder is supplied and discharged by the curved portion of the end side 561, so that the stagnation of the solder is prevented.

The present invention is not limited to these embodiments, but variations and modifications may be made without departing from the scope of the present invention.

For example, in the above-discussed embodiments, the electronic part 111 has a structure where the leads 122 extend from four sides. However, the present invention is not limited to this. The present invention can be applied an electronic part having a structure where the lead extend from a single side or two sides and the same effect can be achieved.

In addition, the electronic part of the present invention is not limited to a semiconductor integrated circuit. The electronic part of the present invention may be a passive component such as a chip resister, chip condenser, chip inductor, or the like. The electronic part of the present invention may be a discrete component such as a transistor or the like. In these cases, the same effect can be achieved.

This patent application is based on Japanese priority patent application No. 2005-95084 filed on Mar. 29, 2005, the entire contents of which are hereby incorporated by reference.

What is claimed is:

1. A circuit board, where a connection part of an electronic part is soldered, comprising:
a plurality of land parts boards provided on the circuit board that are substantially parallel to each other, said plurality of elongated land parts being where electronic parts are to be soldered to said circuit board, each land part having a straight inclination part connecting two sides facing each other of the land part;
the elongated land parts having a first land part and a second land part, the first land part having first inclination parts, the first inclination parts provided in parallel to each other and formed in a first direction, the second land part having second inclination parts provided in parallel to each other in a second direction parallel to the first direction.

2. The circuit board as claimed in claim 1,
wherein the inclination part is formed at an external circumferential side of a head end part.

3. The circuit board as claimed in claim 1,
wherein the land part has a second end side opposite the inclination part.

4. The circuit board as claimed in claim 1,
wherein the inclination part is formed by the shape of a resist film over the land part.

5. The circuit board as claimed in claim 1,
wherein the inclination part is between approximately 30 degrees and approximately 45 degrees from an end line of the connection part of an electronic part.

6. A printed wiring board comprising:
a plurality of elongated land parts provided on the printed wiring board, each land part having a straight inclination part that connects two sides of the land part that face each other, the inclination parts of the plurality of elongated land parts being provided in parallel to each other:
the land parts having a first land part and a second land part, the first land part having an inclination part formed in parallel with a first direction so that solder flaws in a second direction that is at an angle relative to the first direction, the second land part having an inclination part formed in parallel with the first direction so that solder flows in a third direction different from the first and second directions.

7. The printed wiring board as claimed in claim 6,
wherein the inclination part is formed to have an angle of between approximately 30 degrees and approximately 45 degrees.

8. The printed wiring board as claimed in claim 6,
wherein a portion of the inclination part is curved.

9. The printed wiring board as claimed in claim 6,
wherein the inclination part is formed by shaping a resist film over an end side of the land part so that a concave portion is formed.

10. An electronic device, comprising:
an electronic part;
a printed wiring board where a land part is formed, the land part being where a connection part of an electronic part is soldered, the land part comprising:
a plurality of elongated land parts that are provided on the printed wiring board, each land part having a straight inclination part that connects two sides of the land part that face each other; the inclination parts of the plurality of elongated land parts being parallel to each other; the land parts having a first land part and a second land part, the first land part having a first inclination part parallel to a first direction such that solder flows in a second direction relative to the first direction, the second land part having an inclination part formed parallel to the first direction such that solder flows in a third direction that is different from the first and second directions.

11. The electronic device as claimed in claim 10,
wherein the inclination part is formed by forming a resist film over an end side of the land part so that a convex portion is formed over the land part.

12. The electronic device as claimed in claim 11,
wherein the convex portion of the inclination part is curved.

13. The electronic device as claimed in claim 10,
wherein the inclination part is formed by forming a resist film over an end side of the land part so that a concave portion is formed over the land part.

14. The electronic device as claimed in claim 13,
wherein the concave portion of the inclination part is curved.

* * * * *